United States Patent
You et al.

(10) Patent No.: US 8,084,372 B2
(45) Date of Patent: Dec. 27, 2011

(54) SUBSTRATE PROCESSING METHOD AND COMPUTER STORAGE MEDIUM

(75) Inventors: Gen You, Nirasaki (JP); Makoto Muramatsu, Nirasaki (JP); Hiroyuki Fujii, Koshi (JP); Shouichi Terada, Koshi (JP); Takanori Nishi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 12/192,422

(22) Filed: Aug. 15, 2008

(65) Prior Publication Data
US 2009/0053904 A1 Feb. 26, 2009

(30) Foreign Application Priority Data

Aug. 24, 2007 (JP) .................................. 2007-217807
Jul. 25, 2008 (JP) .................................. 2008-192129

(51) Int. Cl.
*H01L 21/31* (2006.01)
*H01L 21/469* (2006.01)
(52) U.S. Cl. .................................. 438/781; 257/E21.24
(58) Field of Classification Search .................. 438/781; 257/E21.24
See application file for complete search history.

(56) References Cited

U.S. PATENT DOCUMENTS

| 5,614,271 | A  | * | 3/1997 | Shibuya et al. | 427/541 |
| 2004/0072429 | A1 | * | 4/2004 | Hieda et al. | 438/689 |
| 2005/0079720 | A1 | * | 4/2005 | Aoyama et al. | 438/695 |
| 2006/0281336 | A1 | * | 12/2006 | Arisumi et al. | 438/787 |
| 2009/0140235 | A1 | * | 6/2009 | Kamata et al. | 257/40 |

FOREIGN PATENT DOCUMENTS

| JP | 7-206410 | 8/1995 |
| JP | 10-70118 | 3/1998 |
| JP | 11-181290 | 7/1999 |
| JP | 2003-158121 | 5/2003 |
| JP | 2005-175405 | 6/2005 |
| JP | 3696939 | 7/2005 |

OTHER PUBLICATIONS

Office Action issued Jul. 26, 2011, in Japanese Patent Application No. JP2008-192129 with English Translation.

* cited by examiner

*Primary Examiner* — Charles Garber
*Assistant Examiner* — Calvin Choi
(74) *Attorney, Agent, or Firm* — Oblon, Spivak, McClelland, Maier & Neustadt, L.L.P.

(57) ABSTRACT

In the present invention, a coating solution containing polysilazane is applied to a substrate to form a coating film. Thereafter, an ultraviolet ray is applied to the coating film formed on the substrate to cut a molecular bond of polysilazane in the coating film. Then, the coating film in which the molecular bond of polysilazane has been cut is oxidized while the coating film is being heated. Then, the oxidized coating film is baked at a baking temperature equal to or higher than a heating temperature when the coating film is oxidized.

10 Claims, 13 Drawing Sheets

(i)

(ii)

(iii)

(iv)

(v)

SUBSTRATE PROCESSING METHOD AND COMPUTER STORAGE MEDIUM

BACKGROUND OF THE INVENTION

1. Field of the Invention

The present invention relates to a substrate processing method and a computer storage medium storing a program for causing the substrate processing method to be executed.

2. Description of the Related Art

For example, in a manufacturing process of a multilayer wiring structure such as a semiconductor integrated circuit, for example, processing of forming an insulating film such as a $SiO_2$ film (silicon oxide film) on the semiconductor wafer (hereinafter, referred to as a "wafer") is performed. For the formation of the $SiO_2$ film, conventionally used is a method of applying a coating solution containing polysilazane ($SiH_2NH$) to the wafer, then oxidizing the coating film on the wafer in an atmosphere containing oxygen or water vapor, and then baking it. To efficiently oxidize the coating film, the atmosphere for oxidizing the coating film is usually brought to a high temperature.

When the coating film is oxidized in the atmosphere at the high temperature as described above, however, oxidation of, for example, a surface layer W' of the wafer W made of silicon may proceed together with the oxidation of a coating film Q as shown in FIG. 13 because of a high oxidation degree of the atmosphere at the high temperature. This will vary the thickness of the wafer W, the width and height of the pattern and so on. Hence, for the formation of the $SiO_2$ film, there is a proposed method of applying a coating solution to the wafer W, then drying the solution while increasing the temperature to a final temperature at a relatively low temperature, for example, selected from a range from 240° C. to 350° C. to form a coating film Q, subsequently applying ultraviolet rays to the coating film Q to oxidize the coating film Q, and then baking it (Japanese Patent No. 3696939).

SUMMARY OF THE INVENTION

When the coating film Q is oxidized while ultraviolet rays are being applied to the coating film Q as described above, however, hardening of the coating film Q also occurs at the same time with the oxidation reaction of the coating film Q. In that case, especially when the thickness of the coating film Q is large, only a surface layer portion Q' of the coating film Q is oxidized and hardened as shown in FIG. 14, but its inner part has not been oxidized sometimes. As a result of this, the coating film Q has been formed non-uniform in the thickness direction on the wafer W.

The present invention has been developed in consideration of the above points, and its object is to oxidize even an inner part of a coating film on a substrate to form a uniform coating film on the substrate.

To achieve the above object, the present invention is a substrate processing method, including: a coating step of applying a coating solution containing polysilazane to a substrate to form a coating film; an ultraviolet irradiation step of applying an ultraviolet ray to the coating film formed on the substrate to cut a molecular bond of polysilazane in the coating film; an oxidation step of oxidizing the coating film in which the molecular bond of polysilazane has been cut while heating the coating film; and a baking step of baking the oxidized coating film, wherein a heating temperature of the coating film in the oxidation step is equal to or lower than a baking temperature of the coating film in the baking step.

According to the present invention, the coating solution containing polysilazane is applied to the substrate, and then an oxidized film that is a desired coating film is formed dividedly in three stages. More specifically, an ultraviolet ray is applied to the coating film formed on the substrate to perform processing of cutting the molecular bond of Si—N and the molecular bond of Si—H in the coating film even in the inner part thereof. Then, the coating film in which the molecular bond of polysilazane has been cut is oxidized while heating the coating film. Since the molecular bond of Si—N and the molecular bond of Si—H of polysilazane have been cut, thereby facilitating an oxidation factor to contact with the whole coating film, so that the treatment of oxidizing the coating film can be performed, for example, in the atmosphere containing oxygen or water vapor at a temperature equal to or lower than the baking temperature. Thereafter, the oxidized coating film is heated to be baked, whereby a desired oxide film is formed on the substrate. Since the application of the ultraviolet rays cuts the molecular bond of Si—N and the molecular bond of Si—H of polysilazane in the coating film even in the inner part thereof, so that the coating film can be easily oxidized also in an atmosphere at a temperature equal to or lower than the baking temperature so that even the inner part of the coating film can be uniformly oxidized. Therefore, use of the substrate processing method of the present invention can oxidize even the inner part of the coating film on the substrate to uniformly form a desired coating film on the substrate.

The invention according to another aspect is a computer readable storage medium storing a program running on a computer of a control unit for controlling a substrate processing unit to cause a substrate processing method to be executed by the substrate processing unit.

DETAILED DESCRIPTION OF THE INVENTION

Figure 1:
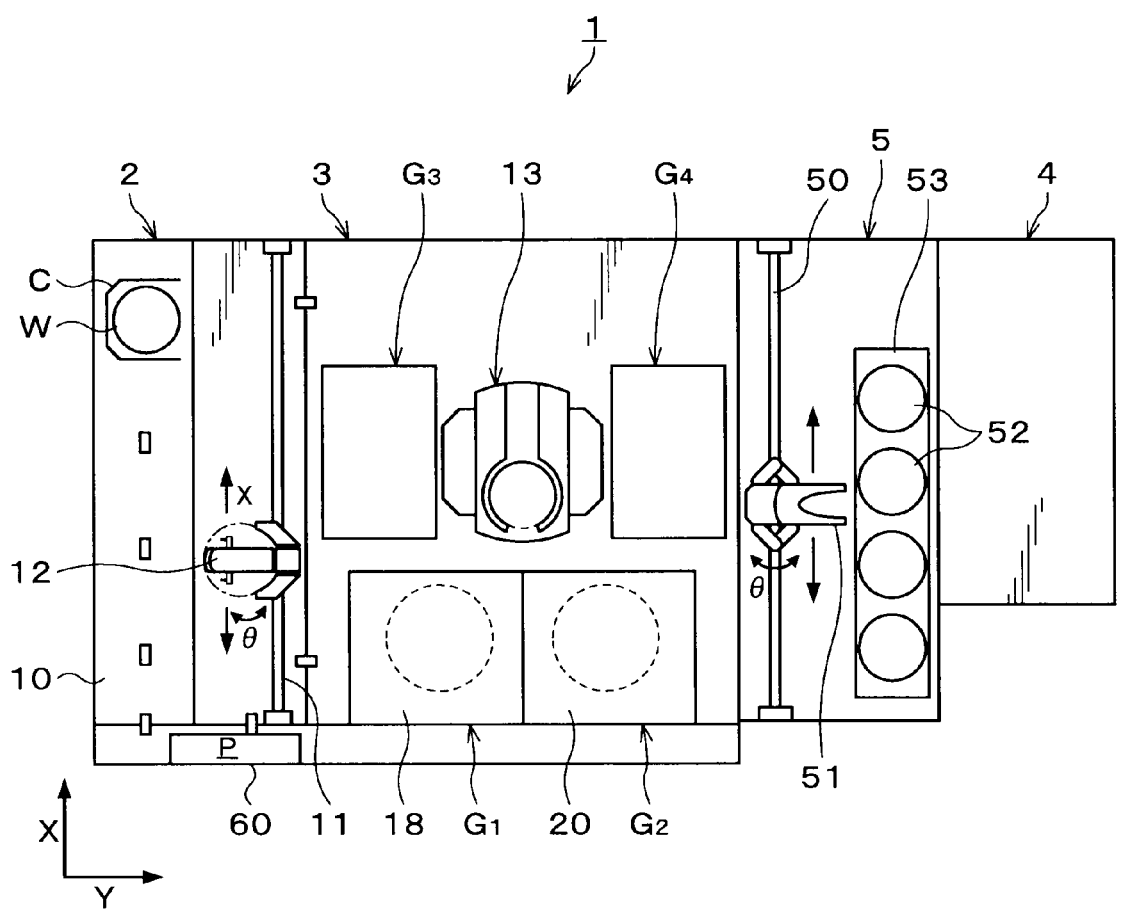
FIG. 1 is a plan view showing the outline of a configuration of a substrate processing system for realizing a substrate processing method according to this embodiment.
Figure 2:
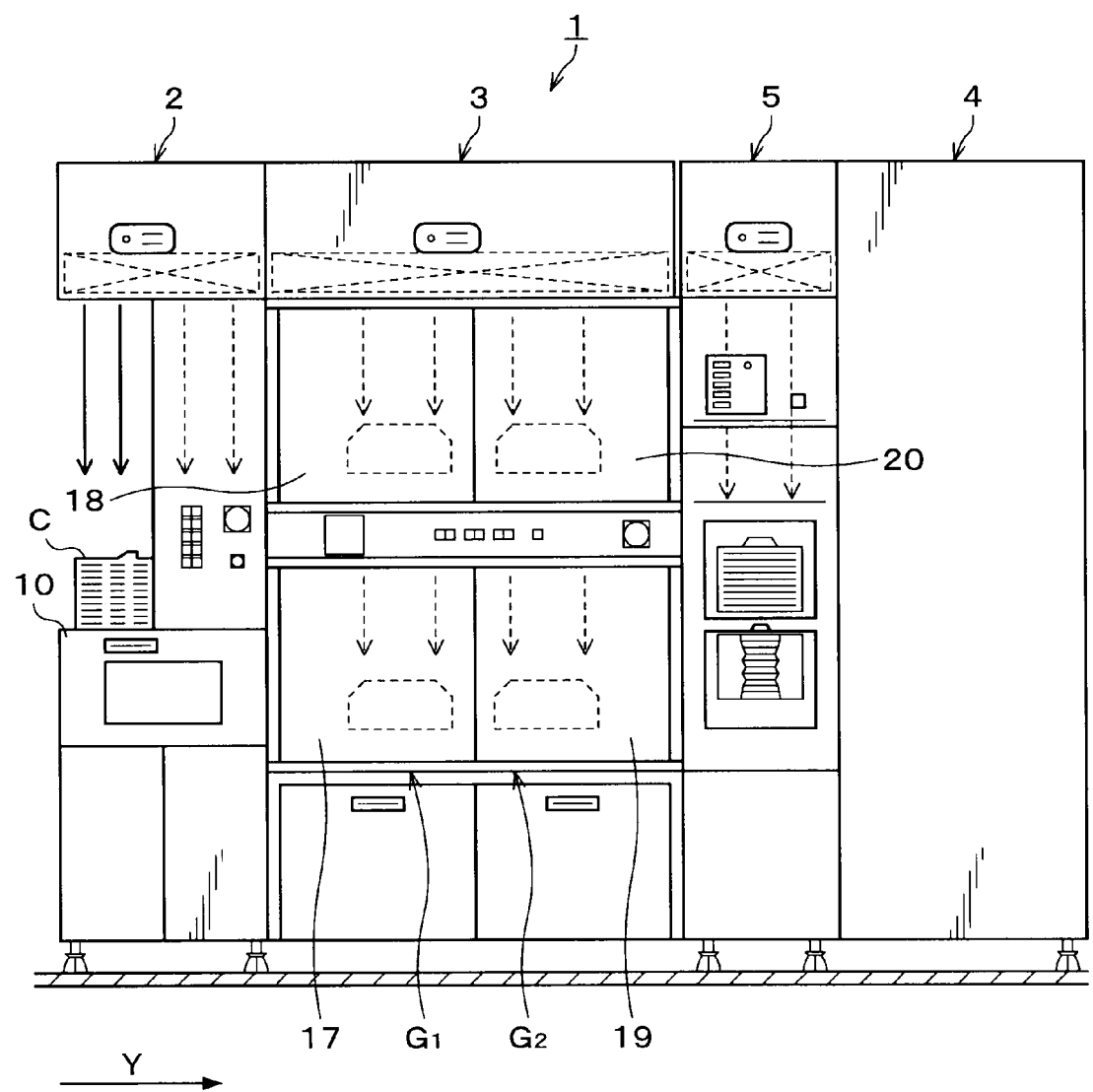
FIG. 2 is a front view of the substrate processing system according to this embodiment.
Figure 3:
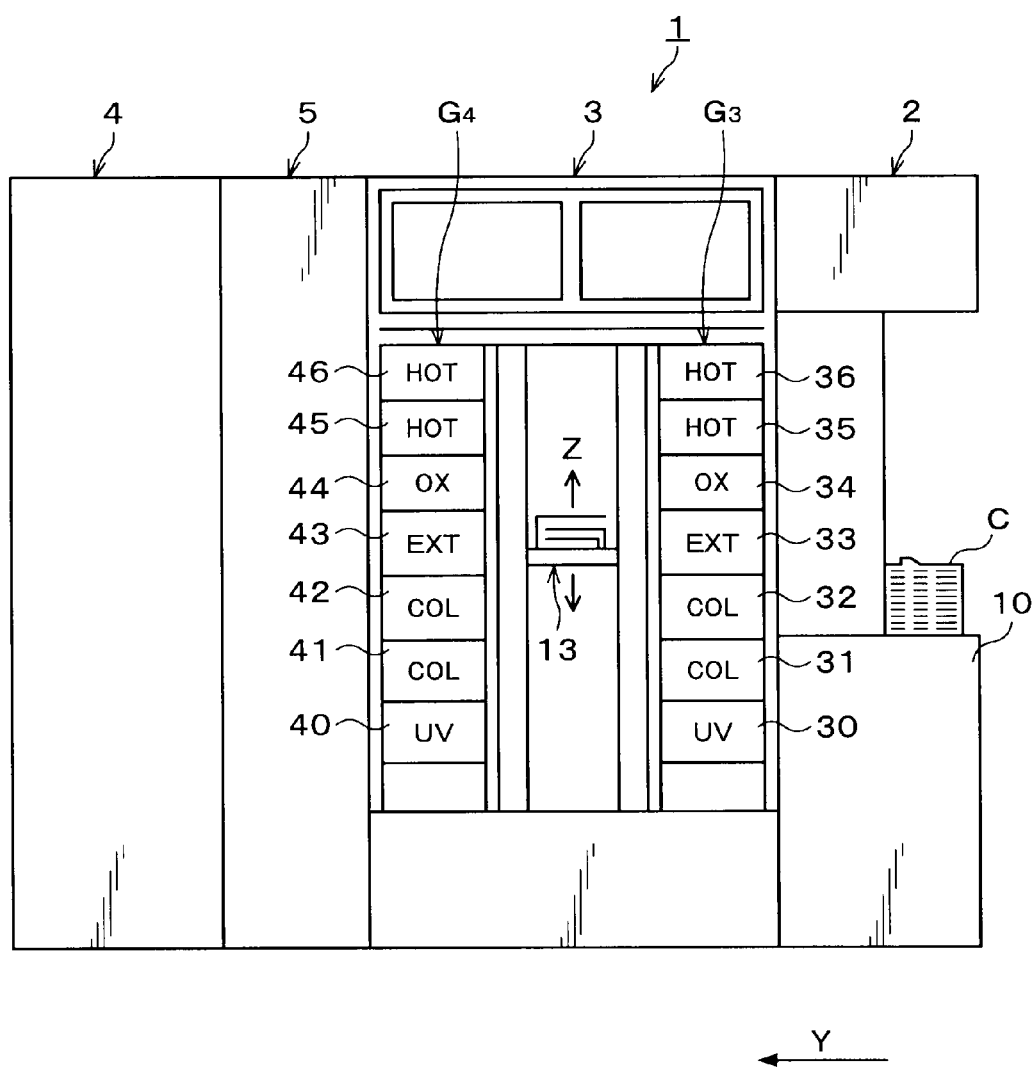
FIG. 3 is a rear view of the substrate processing system according to this embodiment.

Hereinafter, embodiments of the present invention will be described. FIG. 1 is a plan view showing the outline of a configuration of a substrate processing system 1 in which a substrate processing method according to this embodiment is carried out, FIG. 2 is a front view of the substrate processing system 1, and FIG. 3 is a rear view of the substrate processing system 1.

The substrate processing system 1 has, as shown in FIG. 1, a configuration in which a cassette station 2 for transferring, for example, 25 wafers W per cassette as a unit from/to the outside into/from the substrate processing system 1 and transferring the wafers W into/out of a cassette C; a processing station 3 including a plurality of processing and treatment units, which are multi-tiered, for performing various kinds of predetermined processing and treatment in a series of wafer processing; and an interface station 5 for delivering the wafer W to/from a batch-type heating furnace 4 provided adjacent to the processing station 3 are integrally connected.

In the cassette station 2, a cassette mounting table 10 is provided and configured such that a plurality of cassettes C can be mounted thereon in a line in an X-direction (a top-to-bottom direction in FIG. 1). In the cassette station 2, a wafer transfer body 12 is provided which is movable in the X-direction on a transfer path 11. The wafer transfer body 12 is also movable in a wafer-arrangement direction of the wafers W housed in the cassette C (a Z-direction; the vertical direction), and thus can selectively access the wafers W in each of the cassettes C arranged in the X-direction.

The wafer transfer body 12 is rotatable in a θ-direction about the Z-axis, and can also access an extension unit 33 included in a later-described third processing unit group G3 on the processing station 3 side.

At the central portion in the processing station 3, a main transfer unit 13 is provided, around which various kinds of processing and treatment units are multi-tiered to constitute processing unit groups. In the substrate processing system 1, four processing unit groups G1, G2, G3, and G4 are arranged such that the first and second processing unit groups G1 and G2 are arranged on the front side of the substrate processing system 1, the processing unit group G3 is disposed adjacent to the cassette station 2, and the fourth processing unit group G4 is disposed adjacent to the interface station 5. The main transfer unit 13 can transfer the wafer W to each of later-described various kinds of processing and treatment units arranged in these processing unit groups G1 to G4.

In the first processing unit group G1, as shown in FIG. 2, for example, coating treatment units 17 and 18 for applying a coating solution onto the wafer W are two-tiered in order from the bottom. Similarly in the second processing unit group G2, coating treatment units 19 and 20 are two-tiered in order from the bottom. Note that the coating solution applied onto the wafer W in the coating treatment units 17 to 20 contains polysilazane.

In the third processing unit group G3, as shown in FIG. 3, for example, an ultraviolet irradiation unit 30 for applying ultraviolet rays to the wafer W, cooling processing units 31 and 32 each for performing cooling processing on the wafer W, the extension unit 33 for keeping the wafer W waiting therein, an oxidation treatment unit 34 for oxidizing the coating film on the wafer W, and heating processing units 35 and 36 each for heat-processing the wafer W, are seven-tiered in order from the bottom.

In the fourth processing unit group G4, for example, an ultraviolet irradiation unit 40 for applying ultraviolet rays to the wafer W, cooling processing units 41 and 42, an extension unit 43, an oxidation treatment unit 44, and heating processing units 45 and 46, are seven-tiered in order from the bottom.

In the interface station 5, a wafer transfer body 51 moving on a transfer path 50 extending in the X-direction is provided as shown in FIG. 1. Further, on the side of the heating furnace 4 in the interface station 5, a mounting table 53 is provided on which a plurality of wafer boats 52 can be arranged side by side in the X-direction. The wafer boat 52 can hold a plurality of wafers W in the vertical direction at multiple tiers. The wafer transfer body 51 is movable in the vertical direction and also rotatable in the θ-direction and can transfer the wafer W between the processing station 3 and the wafer boat 52 on the mounting table 53. The heating furnace 4 can house the wafer boat 52 from the interface station 5 and simultaneously heat a plurality of wafers W at a high temperature.

Next, the configuration of the above-described coating treatment unit 17 will be described with reference to FIG. 4. The coating treatment unit 17 has a treatment container 100 whose inside can be hermetically closed. On one side surface of the treatment container 100, a transfer-in/out port 101 for the wafer W is formed in a surface facing a transfer-in region for the main transfer unit 13 being a transfer means for the wafer W, and an opening/closing shutter 102 is provided at the transfer-in/out port 101.

Inside the treatment container 100, a spin chuck 110 is provided which horizontally suction-holds the wafer W on its upper surface. The spin chuck 110 can be rotated about the vertical axis by a drive mechanism 111 including a motor and so on. The drive mechanism 111 is provided with a raising and lowering drive source (not shown) such as a cylinder so that the spin chuck 110 can rise and lower.

Around the spin chuck 110, a cup body 112 is provided which receives and collects liquid splashing or dropping from the wafer W. The upper face of the cup body 112 is formed with an opening portion which is larger than the wafer W and the spin chuck 110 to allow the spin chuck 110 holding the wafer W thereon to rise and lower therethrough. The bottom portion of the cup body 112 is formed with a drain port 113 for draining the collected coating solution and an exhaust port 114 for exhausting the atmosphere in the cup body 112. The drain port 113 and the exhaust port 114 are connected to a drain pipe 115 and an exhaust pipe 116 respectively, and an exhaust pump 117 for exhausting the atmosphere in the treatment container 100 to create a vacuum is connected to the exhaust pipe 116.

Above the spin chuck 110, a coating nozzle 120 is located for applying the coating solution onto the central portion of the front surface of the wafer W. The coating nozzle 120 is connected to a coating solution supply source (not shown) which supplies the coating solution.

Figure 5:
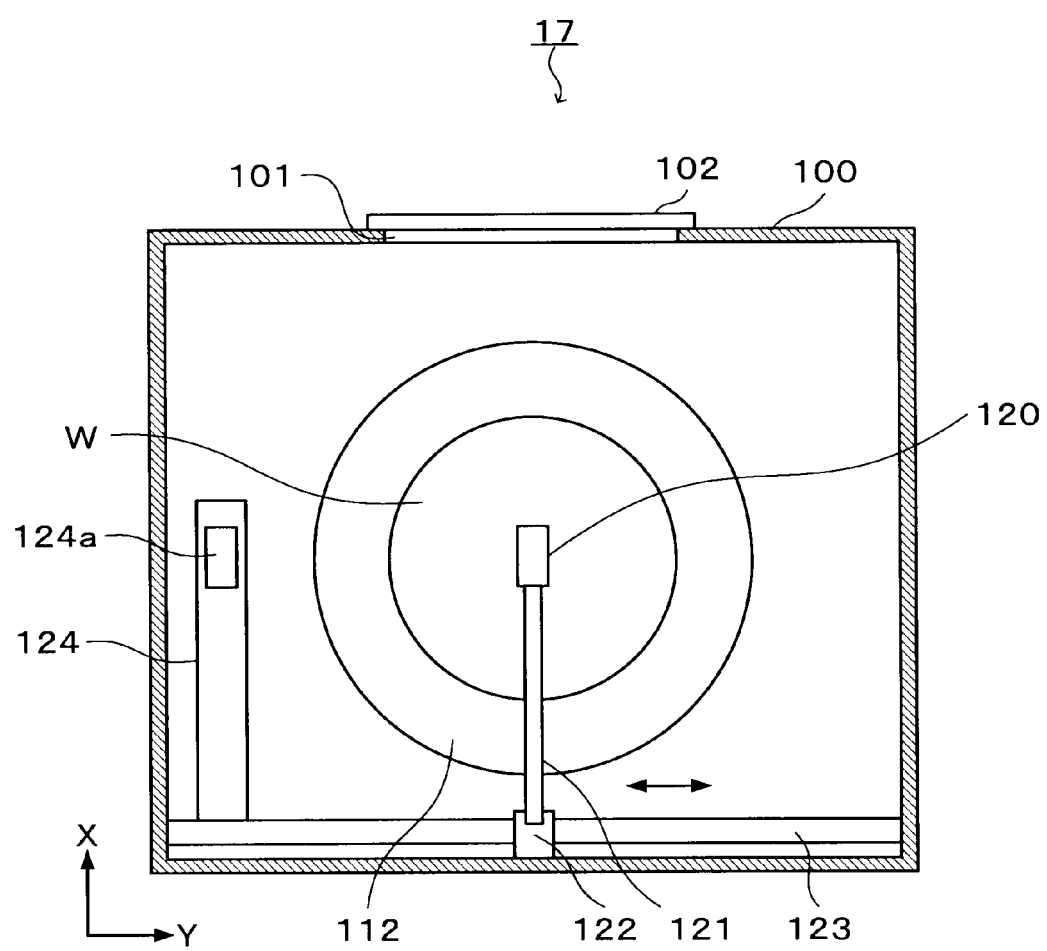
FIG. 5 is an explanatory view of a transverse section showing the outline of the configuration of the coating treatment unit.

The coating nozzle 120 is connected to a moving mechanism 122 via an arm 121 as shown in FIG. 5. The arm 121 can be moved by the moving mechanism 122 along a guide rail 123 provided along the length direction (the Y-direction) of the treatment container 100, from a waiting region 124 provided outside on the one end side of the cup body 112 (the left side in FIG. 5) toward the other end side and vertically moved. The waiting region 124 is configured to be able to accommodate the coating nozzle 120 and has a cleaning portion 124a which can clean the tip end portion of the coating nozzle 120.

Figure 4:
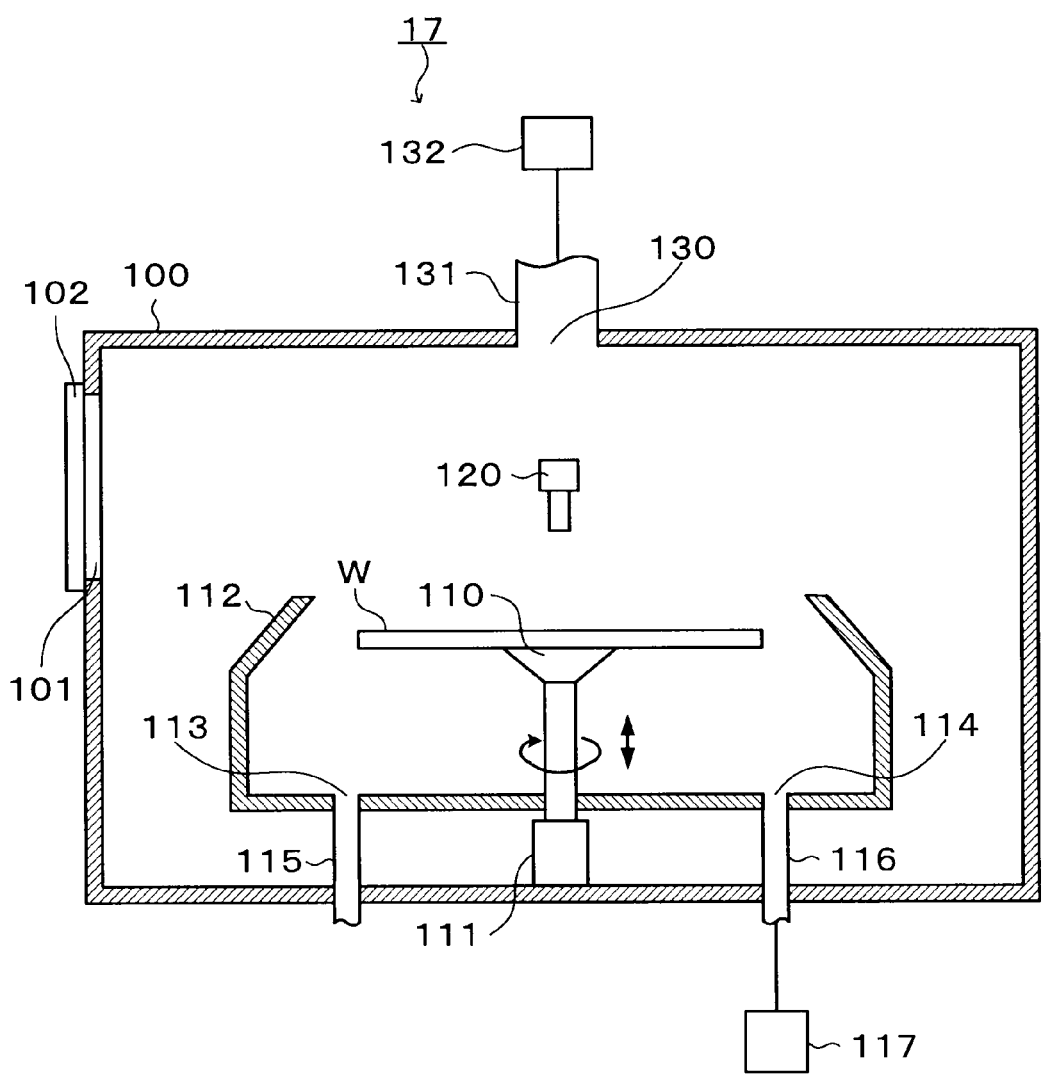
FIG. 4 is an explanatory view of a longitudinal section showing the outline of a configuration of a coating treatment unit.

A gas supply port 130 for supplying an inert gas such as a nitrogen gas or the like is formed at the central portion of the ceiling surface of the treatment container 100 as shown in FIG. 4. To the gas supply port 130, a gas supply source 132 for supplying the inert gas via a gas supply pipe 131 is connected.

Note that the configuration of the coating treatment units 18, 19 and 20 is the same as that of the above-described coating treatment unit 17 and therefore the explanation for them will be omitted.

Figure 6:
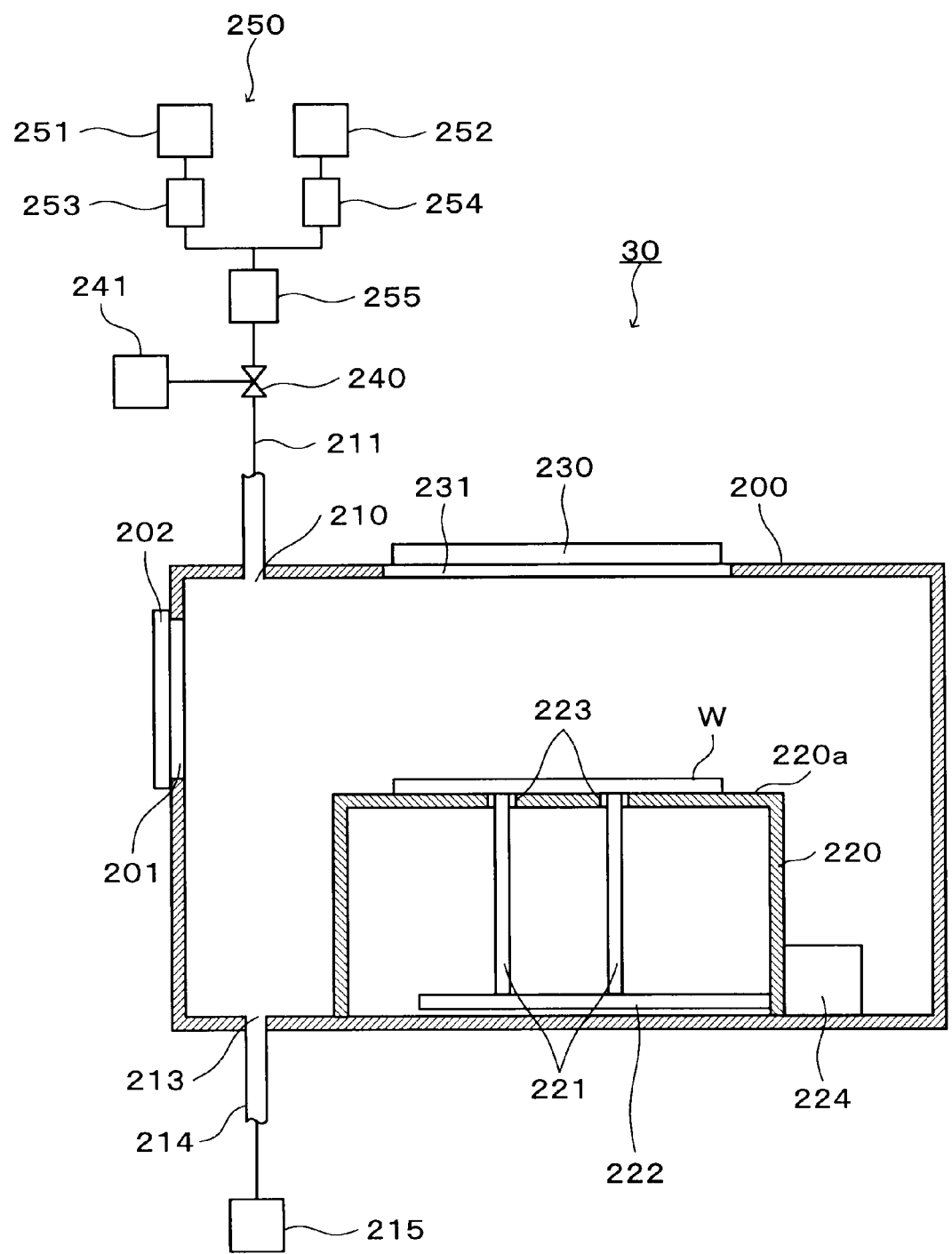
FIG. 6 is an explanatory view of a longitudinal section showing the outline of a configuration of an ultraviolet irradiation unit.

Next, the configuration of the aforementioned ultraviolet irradiation unit 30 will be described. The ultraviolet irradiation unit 30 has, as shown in FIG. 6, a treatment container 200 whose inside can be hermetically closed. On one side surface of the treatment container 200, a transfer-in/out port 201 for the wafer W is formed in a surface facing a transfer-in region for the main transfer unit 13 being a transfer means for the wafer W, and an opening/closing shutter 202 is provided at the transfer-in/out port 201.

An upper surface of the treatment container 200 is formed with a gas supply port 210 for supplying an oxidizing gas that is, for example, an atmospheric gas or a mixed gas having an adjusted oxygen concentration toward the inside of the treatment container 200, and a gas supply pipe 211 for supplying the oxidizing gas is connected to the gas supply port 210. To the gas supply pipe 211, an atmosphere supply source 241 for supplying an atmospheric gas as the oxidizing gas to the gas supply port 210 and a mixed gas supply mechanism 250 for supplying the mixed gas to the gas supply port 210 are connected via a three-way valve 240. The mixed gas supply mechanism 250 has an oxygen supply source 251 storing an oxygen gas and a nitrogen supply source 252 storing a nitrogen gas. The oxygen supply source 251 and the nitrogen supply source 252 are provided with flow regulators 253 and 254 for regulating the supply amounts of the oxygen gas and the nitrogen gas respectively to mix the oxygen gas and the nitrogen gas at a predetermined mixture ratio. A mixer 255 which mixes the oxygen gas and the nitrogen gas supplied from the oxygen supply source 251 and the nitrogen supply source 252 at a predetermined mixture ratio is provided downstream the flow regulators 253 and 254. By controlling the three-way valve 240, the atmospheric gas supplied from the atmosphere supply source 241 or the mixed gas mixed at the mixer 255 is supplied to the gas supply port 210. Note that switching of the three-way valve 240 and the mixture ratio of the oxygen gas and the nitrogen gas are set depending on conditions such as the kind of the coating film, the dimension of the pattern, the film thickness of the coating film and so on. For example, the oxygen gas concentration is increased when the ultraviolet irradiation processing is performed in a short time, while the oxygen gas concentration is decreased when the ultraviolet irradiation processing is performed taking a long time. Note that though the mixed gas is generated by mixing the oxygen gas and the nitrogen gas in this embodiment, the oxygen gas and a non-oxidizing gas other than the nitrogen gas may be mixed.

A bottom surface of the treatment container 200 is formed with an exhaust port 213 for exhausting the atmosphere in the treatment container 200. To the exhaust port 213, an exhaust pump 215 for exhausting the atmosphere in the treatment container 200 to create a vacuum is connected via an exhaust pipe 214.

In the treatment container 200, a cylindrical support 220 for horizontally mounting the wafer W thereon is provided. In the support 220, rising/lowering pins 221 for delivering the wafer W are provided, supported on a supporting member 222. For example, three rising/lowering pins 221 are provided to penetrate through holes 223 formed in an upper surface 220a of the support 220. At a base end portion of the supporting member 222, a drive mechanism 224 is provided which includes a motor and so on for raising/lowering the rising/lowering pins 221 and the supporting member 222.

Above the treatment container 200, an ultraviolet irradiator 230 is provided, such as a deuterium lamp or an excimer lamp applies, for example, ultraviolet rays having a wavelength of 172 nm to the wafer W on the support 220. The ultraviolet irradiator 230 can apply ultraviolet rays to the entire surface of the wafer W. A ceiling plate of the treatment container 200 is provided with a window 231 through which the ultraviolet rays from the ultraviolet irradiator 230 pass. Note that the wavelength of the ultraviolet rays is not limited to 172 nm, but can be 150 nm to 200 nm. In this case, since the wavelength of the ultraviolet rays is 150 nm or more, the ultraviolet rays are not absorbed by the coating film formed on the wafer W in the coating treatment unit 17 but can advance even into the inner part of the coating film. Further, since the wavelength of the ultraviolet rays is 200 nm or less, the ultraviolet rays has a sufficiently high energy and can therefore cut the molecular bond of Si—N and the molecular bond of Si—H in the coating film as will be described later.

Note that the configuration of the ultraviolet irradiation unit 40 is the same as that of the above-described ultraviolet irradiation unit 30 and therefore the explanation for it will be omitted.

Figure 7:
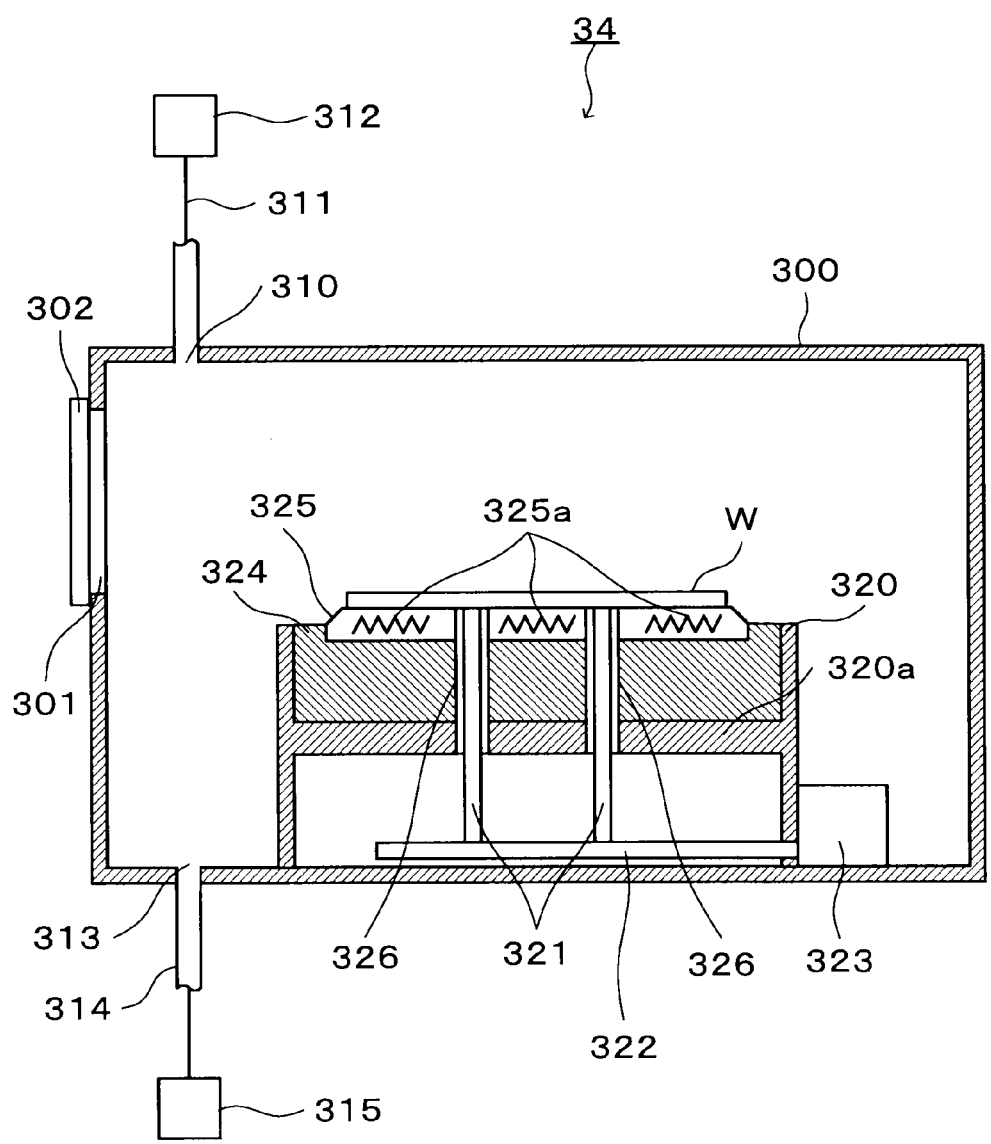
FIG. 7 is an explanatory view of a transverse section showing the outline of a configuration of an oxidation treatment unit.

Next, the configuration of the above-described oxidation treatment unit 34 will be described. The oxidation treatment unit 34 has a treatment container 300 whose inside can be hermetically closed as shown in FIG. 7. On one side surface of the treatment container 300, a transfer-in/out port 301 for the wafer W is formed in a surface facing a transfer-in region for the main transfer unit 13 being a transfer means for the wafer W, and an opening/closing shutter 302 is provided at the transfer-in/out port 301.

An upper surface of the treatment container 300 is formed with a gas supply port 310 for supplying water vapor toward the inside of the treatment container 300, and a water vapor supply source 312 for supplying water vapor via a gas supply pipe 311 is connected to the gas supply port 310. A bottom surface of the treatment container 300 is formed with an exhaust port 313 for exhausting the atmosphere in the treatment container 300, and to the exhaust port 313, an exhaust pump 315 for exhausting the atmosphere in the treatment container 300 to create a vacuum via an exhaust pipe 314 is connected. Note that the water vapor supplied from the gas supply port 310 to the treatment container 300 needs to be supplied at a temperature at which the water vapor does not precipitate and condense. To this end, a heater is preferably provided in the treatment container 300 to maintain the inside of the treatment container 300 at a temperature at which the water vapor does not condense. Further, the supplied water vapor may be controlled in humidity by mixing the water vapor and a carrier gas such as a nitrogen gas or the like.

In the treatment container 300, a cylindrical support 320 is provided which horizontally mounts the wafer W thereon and has an upper surface open. In the support 320, for example, three rising/lowering pins 321 for delivering the wafer W are provided, supported on a supporting member 322. At a base end portion of the supporting member 322, a drive mechanism 323 is provided which includes a motor and so on for raising/lowering the rising/lowering pins 321 and the supporting member 322.

Inside the support 320, a supporting surface 320a is provided above the supporting member 322 for the rising/lowering pins 321. Above the supporting surface 320a, a heat insulator 324 is filled, and a hot plate 325 having heaters 325a therein is provided on the upper surface of the heat insulator 324. The hot plate 325 can horizontally mount and heat the wafer W thereon. The supporting surface 320a of the support 320, the heat insulator 324, and the hot plate 325 are formed with through holes 326 to allow the rising/lowering pins 321 to pass through.

Note that the configuration of the oxidation treatment unit 44 is the same as that of the above-described oxidation treatment unit 34 and therefore the explanation for it will be omitted.

The control of the wafer processing in the substrate processing system 1 configured as described above is conducted by a control unit 60 provided in the cassette station 2 as shown in FIG. 1. The control unit 60 is, for example, a computer which has a program storage unit. The program storage unit stores, for example, a program P which controls the operations of the above-described various kinds of processing and treatment units and the drive system such as transfer units to execute the wafer processing of a later-described predetermined recipe. Note that the program P is stored, for example, in a readable storage medium such as a hard disk (HD), a flexible disk (FD), a memory card, a compact disk, (CD), magneto-optical disk (MO), or the like, and installed into the computer that is the control unit 60.

Figure 8:
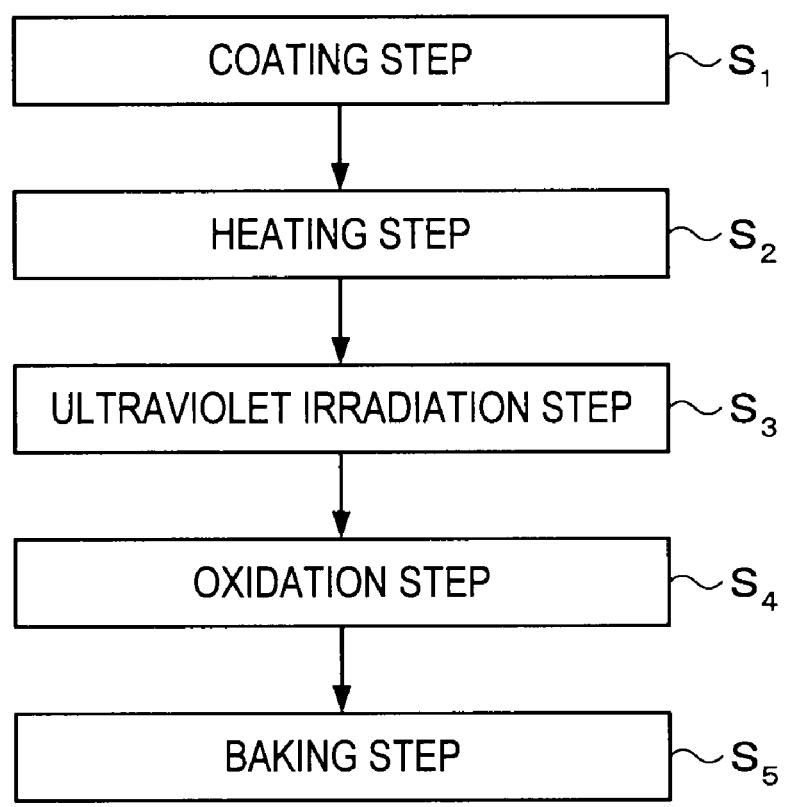
FIG. 8 is a flowchart of a wafer processing.
Figure 9:
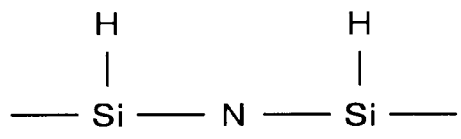
FIG. 9 is an explanatory view showing the state of a coating film on the wafer in each step in FIG. 8.
Figure 9:
Figure 9:
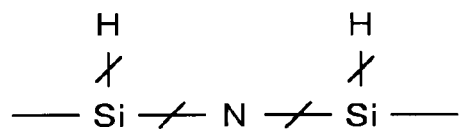
Figure 9:
Figure 9:
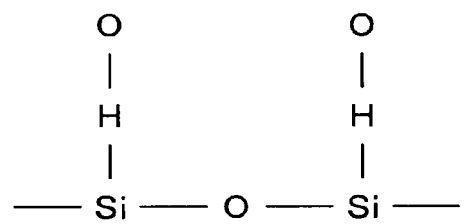
Figure 9:
Figure 9:
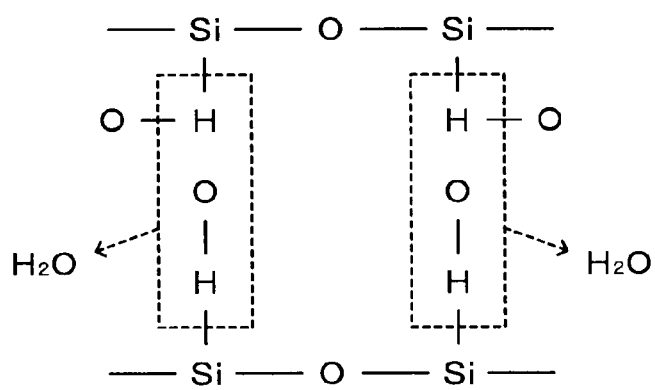
Figure 9:
Figure 9:
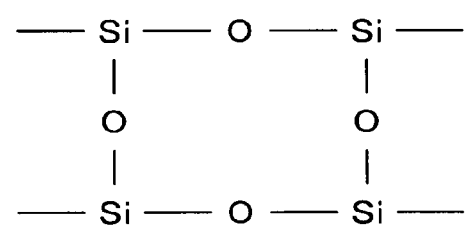

The substrate processing system 1 in which the processing method for the wafer W according to this embodiment is carried out is configured as described above, and processing of forming an $SiO_2$ film on the wafer W performed in the substrate processing system 1 will be described. FIG. 8 shows a main processing flow of the processing for the wafer W, and FIG. 9 shows a state of the coating film on the wafer in each of steps shown in FIG. 8.

First, a wafer W is taken out of the cassette C on the cassette mounting table 10 by the wafer transfer body 12 and transferred to the cooling processing unit 31 via the extension unit 33 in the third processing unit group G3. The wafer W transferred to the cooling processing unit 31 is temperature-regulated to a predetermined temperature and then transferred by the main transfer unit 13 to the coating treatment unit 17.

In the coating treatment unit 17, the wafer W sucked onto the spin chuck 110 is rotated by the drive mechanism 111, and the coating solution is dripped from the coating nozzle 120 onto the central portion of the wafer W. The coating solution applied on the wafer W scatters over the entire front surface of the wafer W by the centrifugal force generated by the rotation of the wafer W to form a coating film on the surface layer of the wafer W (Step S1 in FIG. 8). The coating film on the wafer W in this event contains polysilazane ($SiH_2NH$) shown in FIG. 9(i).

The wafer W on which the coating film has been formed in the coating treatment unit 17 is transferred to the heating processing unit 35. In the heating processing unit 35, the wafer W is heated so that a portion of a solvent in the coating film on the wafer W is evaporated (Step S2 in FIG. 8). In this event, the wafer W is heated at a predetermined temperature, for example, within 200° C.

The wafer W is then transferred to the cooling processing unit 31 and cooled to a predetermined temperature, and then transferred to the ultraviolet irradiation unit 30.

The wafer W transferred to the ultraviolet irradiation unit 30 is mounted on the upper surface 220a of the support 220 by the rising/lowering pins 221. Once the wafer W is mounted on the support 220, the opening/closing shutter 202 is closed to hermetically close the inside the treatment container 200 and the oxidizing gas is supplied from the gas supply port 210 into the treatment container 200. For the supply of the oxidizing gas, the three-way valve 240 is switched, whereby the atmospheric gas supplied from the atmosphere supply source 241 or the mixed gas at a predetermined mixture ratio supplied from the mixed gas supply mechanism 250 is supplied. In this event, exhaust of the atmosphere inside the treatment container 200 from the exhaust port 213 is also started. The ultraviolet irradiator 230 applies the ultraviolet rays with a wavelength of 172 nm to the coating film on the wafer W to thereby perform ultraviolet irradiation processing in the atmosphere of the oxidizing gas (Step S3 in FIG. 8). The ultraviolet rays are applied for a predetermined time, for example, within one minute. Then, the molecular bond of Si—N and the molecular bond of Si—H in the coating film on the wafer W are cut by the application of such ultraviolet rays as shown in FIG. 9(ii).

The wafer W after completion of the ultraviolet irradiation processing is transferred from the ultraviolet irradiation unit 30 to the oxidation treatment unit 34. The wafer W transferred to the oxidation treatment unit 34 is mounted on the hot plate 325 of the support 320 by the rising/lowering pins 321. Once the wafer W is mounted on the hot plate 325, the opening/closing shutter 302 is closed to hermetically close the inside of the treatment container 300, and water vapor is supplied from the gas supply port 310 into the treatment container 300. The water vapor to be supplied is generated, for example, by evaporating water and heated to a predetermined temperature, for example, between 100° C. and 450° C. that is the same as a later-described heating temperature of the wafer W by the hot plate 325. The supply of the water vapor is preferably performed with the inside of the treatment container 300 being sufficiently heated for preventing condensation. In addition, together with the supply of the water vapor, exhaust of the atmosphere inside the treatment container 300 from the exhaust port 313 is started. The hot plate 325 then heats the wafer W at a temperature between 100° C. and 450° C. for a predetermined time, for example, between one minute and five minutes. Then, the coating film on the wafer W is oxidized by the water vapor supplied into the treatment container 300. Concretely, as shown in FIG. 9(iii), N in the coating film on the wafer W is substituted by O (oxygen atom), and H in the coating film is substituted by OH (hydroxyl group) (Step S4 in FIG. 8). Note that if a heater is provided in the treatment container 300, the treatment container 300 may be heated up to the same temperature as the heating temperature of the wafer W.

The wafer W after completion of the oxidation treatment is transferred from the oxidation treatment unit 34 to the extension unit 43, and from the extension unit 43 to the interface station 5. The wafer W is then housed in the wafer boat 52, and at a point in time when a predetermined number of wafers W are housed in the wafer boat 52, the wafers W are transferred to the heating furnace 4 for each wafer boat 52. In the heating furnace 4, the wafers W are heated at a predetermined baking temperature, for example, between 400° C. and 1000° C. for a predetermined time, for example, within 60 minutes in the atmosphere of the inert gas such as the nitrogen gas or the like, whereby the coating film is baked (Step S5 in FIG. 8). In this event, OH in the coating film is dehydrated and condensed as shown in FIG. 9(iv), so that a desired $SiO_2$ film is formed on the wafer W as shown in FIG. 9(v). Note that the baking processing in the heating furnace 4 may be performed in an atmosphere of a non-oxidizing gas such as the above-described inert gas or performed in an atmosphere of the oxidizing gas.

The wafer W after completion of the baking processing is returned via the interface station 5 to the processing station 3, returned from the processing station 3 to the cassette station 2, and returned to the cassette C by the wafer transfer body 12. Thus, a series of processing for the wafer W is completed.

According to the above embodiment, the coating solution is applied to the wafer W to form a coating film in the coating treatment unit 17, and the ultraviolet rays are then applied to the wafer W in the ultraviolet irradiation unit 30 to cut the molecular bond of Si—N and the molecular bond of Si—H in the coating film even in the inner part thereof, thereby facilitating an oxidation factor to contact with the whole coating film, so that the subsequent oxidation treatment of the coating film in the oxidation treatment unit 34 can be easily performed also in an atmosphere at a temperature equal to or lower than the baking temperature between 100° C. and 450° C. Since even the inner part of the coating film can be oxidized, a desired coating film can be uniformly formed on the wafer W.

Further, since the application of the ultraviolet rays in the ultraviolet irradiation unit 30 is performed in the atmosphere of the oxidizing gas, the oxidation of the inner part of the coating film can be promoted to some degree in the ultraviolet irradiation unit 30. In this case, the ultraviolet rays can be applied without hardening the coating film and the subsequent oxidation treatment in the oxidation treatment unit 34 can be performed more easily, thereby ensuring that even the inner part of the coating film can be oxidized.

Further, since the application of the ultraviolet rays in the ultraviolet irradiation unit 30 is performed to cut the molecular bond of Si—N and the molecular bond of Si—H in the coating film, the irradiation time of the ultraviolet rays can be decreased. Moreover, since the oxidation treatment of the coating film in the oxidation treatment unit 34 is performed in the atmosphere between 100° C. and 450° C., the temperature of the atmosphere in which the oxidation treatment is performed does not need to be increased/decreased unlike the prior art, so that the oxidation treatment of the coating film can also be performed in a short time. Accordingly, the processing time for forming a desired coating film on the wafer W can be decreased.

In the above embodiment, when the baking temperature of the wafer W is 450° C. or lower, the baking processing of the wafer W performed in the heating furnace 4 can be performed even in one of the oxidation treatment units 34 and 44. In this case, the baking processing of the wafer W is performed in a manner of single wafer processing in which the inert gas such as the nitrogen gas or the like is supplied into the unit in place of the water vapor. This ensures that even if the required temperature of the baking processing is limited to a relatively low temperature, for example, 450° C. or lower due to diversification of the manufacturing process of the wafer W, the processing method of the present invention can be applied to form a desired coating film on the wafer W.

Figure 10:
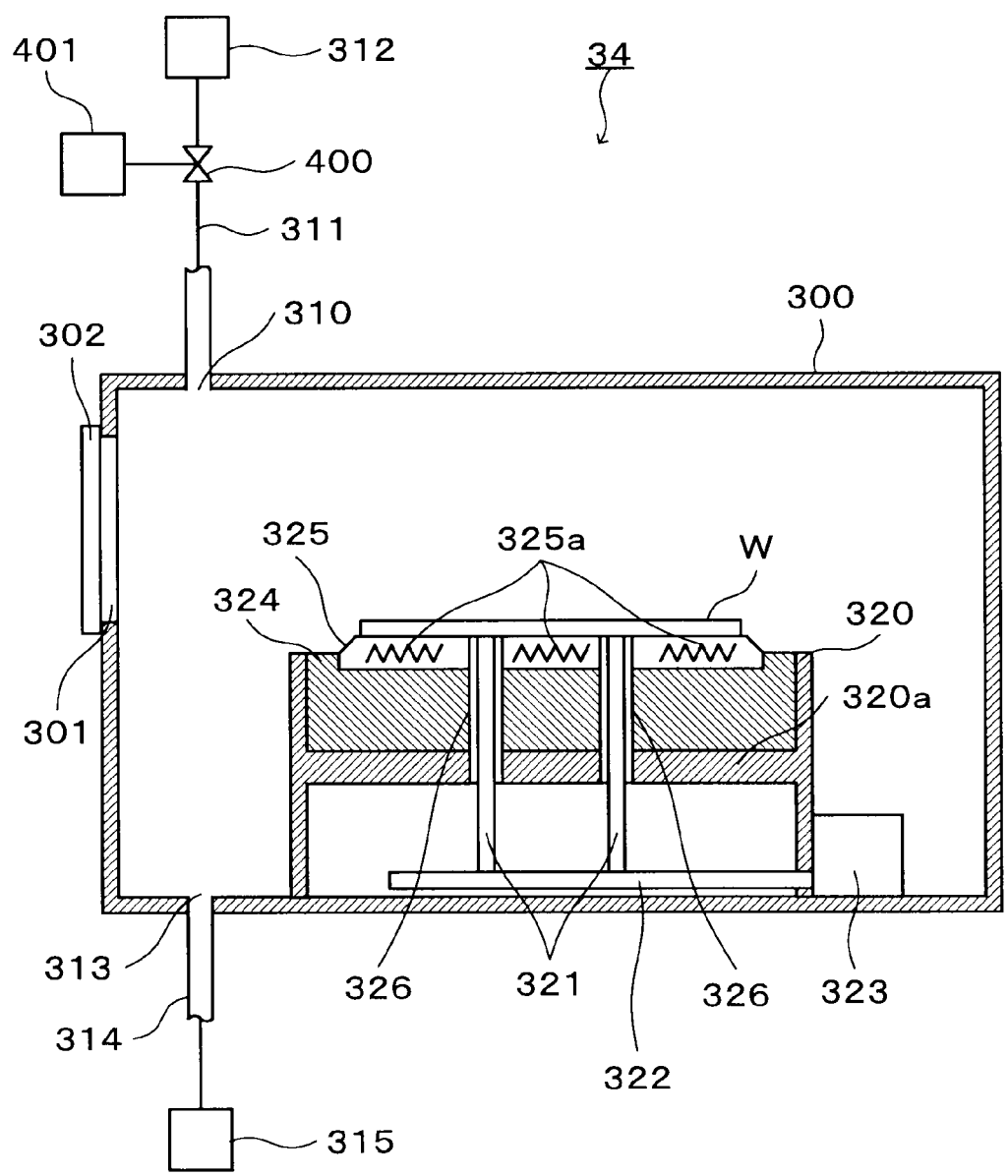
FIG. 10 is a longitudinal sectional view showing the outline of a configuration of an oxidation treatment unit according to another embodiment.

Further, the baking processing at a baking temperature of the wafer W of 450° C. or lower may be successively performed in one and the same oxidation treatment unit 34 in which the oxidation treatment is performed. In this case, to the gas supply pipe 311 of the oxidation treatment unit 34, a water vapor supply source 312 for supplying water vapor to the gas supply port 310 and a nitrogen gas supply source 401 for supplying a nitrogen gas that is a non-oxidizing gas to the gas supply port 310 are connected via a three-way valve 400 as shown in FIG. 10. Note that the other configuration of the oxidation treatment unit 34 is the same as that of the above-described oxidation treatment unit 34 in the above-described embodiment and therefore the explanation for it will be omitted. The three-way valve 400 is first controlled to supply the water vapor from the water vapor supply source 312 into the treatment container 300, and the hot plate 325 heats the wafer W, for example, to 200° C. to perform oxidation treatment of the coating film. After completion of the oxidation treatment, the water vapor in the treatment container 300 is exhausted to the outside, and the three-way valve 400 is then switched to supply the nitrogen gas from the nitrogen gas supply source 401 to the treatment container 300. Subsequently, the wafer W is heated by the hot plate 325 to 430° C. that is the baking temperature to perform baking processing of the coating film. Since the oxidation treatment and the baking processing of the coating film can be successively performed in one and the same unit as described above, the throughput of the wafer processing can be improved. Note that the above-described oxidation treatment and baking processing may be performed such that the oxidation treatment for the coating film is first performed at, for example, 430° C. that is the baking temperature, then the water vapor in the treatment container 300 is exhausted, and the baking processing for the coating film is subsequently performed at the same temperature (430° C.).

Figure 11:
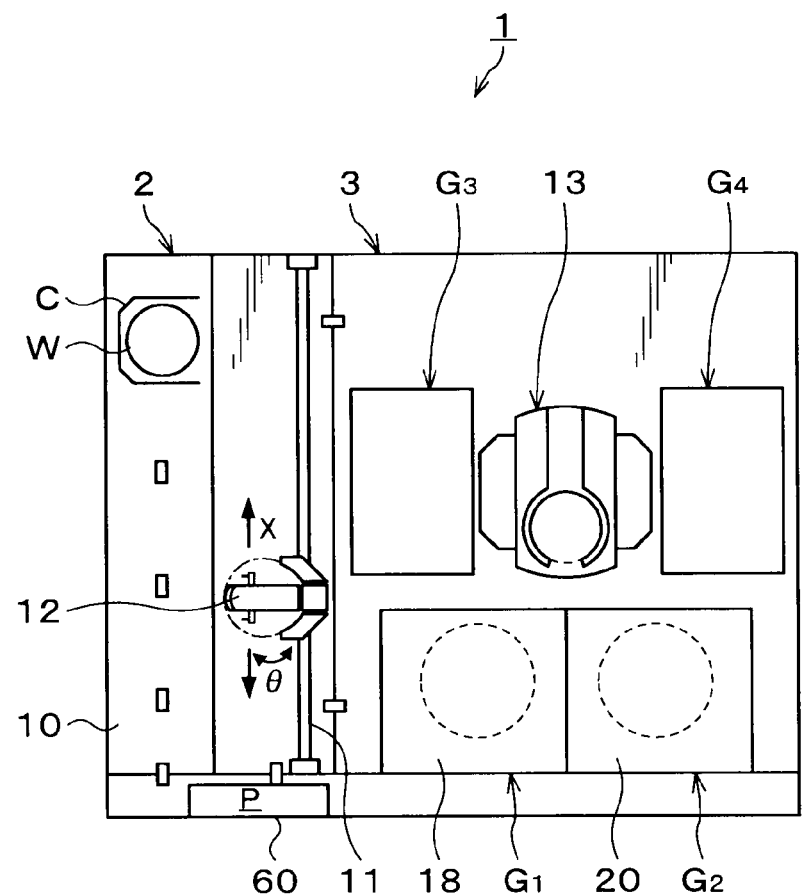
FIG. 11 is a plan view showing the outline of a configuration of a substrate processing system and a heating furnace according to another embodiment.
Figure 11:
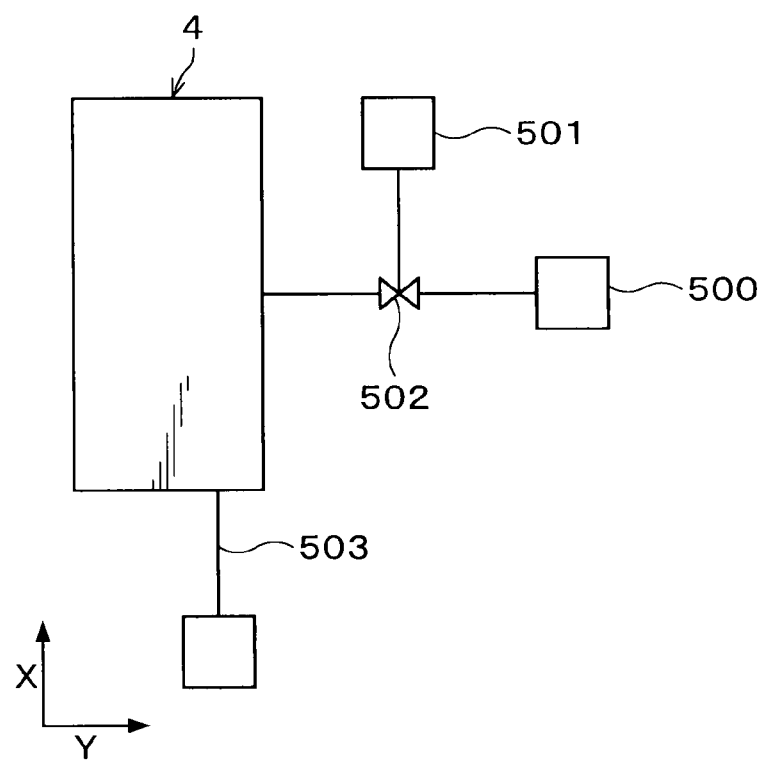

Though the heating furnace 4 is provided adjacent to the substrate processing system 1 via the interface station 5 in the above embodiments, the heating furnace 4 may be provided without connecting to the substrate processing system 1 as show in FIG. 11. In this case, the interface station 5 can be omitted from the substrate processing system 1. To the heating furnace 4, a water vapor supply source 500 for supplying water vapor and a nitrogen gas supply source 501 for supplying a nitrogen gas that is a non-oxidizing gas to the inside of a quartz tube (not shown) that is a processing region inside the heating furnace 4 are connected via a three-way valve 502. Further, exhaust of an atmosphere in the furnace is performed by an exhaust line 503 which is connected to the quartz tube. In the substrate processing system 1, the coating treatment (Step S1 in FIG. 8), the heating processing (Step S2 in FIG. 8), and the ultraviolet irradiation processing (Step S3 in FIG. 8) which have been described in the above embodiment are performed first. Thereafter, the wafer W after completion of the ultraviolet irradiation processing is transferred to the heating furnace 4 for every predetermined number of wafers. In the heating furnace 4, the three-way valve 502 is first controlled to supply the water vapor from the water vapor supply source 500 into the heating furnace 4 and the wafer W is heated to a predetermined temperature, whereby oxidation treatment for the coating film is performed (Step S4 in FIG. 8). After completion of the oxidation treatment, the water vapor in the heating furnace 4 is exhausted to the outside, and the three-way valve 502 is then switched to supply the nitrogen gas from the nitrogen gas supply source 501 into the heating furnace 4. Subsequently, the wafer W is heated to the baking temperature, whereby baking processing for the coating film is performed (Step S5 in FIG. 8). Also in this case, a desired coating film can be formed on the wafer W. Note that a plurality of heating furnaces 4 may be provided, and the oxidation treatment and the baking processing may be separately performed in the heating furnaces 4.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiments but may take various aspects. The present invention is also applicable to the case in which the substrate is other substrates such as an FPD (Flat Panel Display), a mask reticle for a photomask, and the like other than the wafer.

The present invention is useful in a processing method and a substrate processing system each for forming a coating film on a substrate, such as a semiconductor wafer or the like.

EXAMPLE

Hereinafter, for the effect of the wafer processing method of the present invention, FTIR (Fourier Transform Infrared Spectrometer) measurement was carried out to measure the FTIR spectrum of the coating film on the wafer in each of the processing steps. Note that for performing this example, the substrate processing system 1 previously shown in FIG. 1 was used as the equipment for performing the wafer processing, and the processing followed the flow shown in FIG. 8.

In the coating treatment unit 17, the coating solution containing polysilazane was applied to the wafer W to form the coating film (Step S1 in FIG. 8), and the following processing and treatment were performed in sequence.

(1) The wafer W was heated in the heating processing unit 35. The heating processing for the wafer W was carried out at a temperature of 150° C. (Step S2 in FIG. 8).

(2) Then, the ultraviolet rays with a wavelength of 172 nm were applied to the coating film on the wafer W in the ultraviolet irradiation unit 30. The application of the ultraviolet rays was performed in the atmosphere of an oxidizing gas at room temperatures (Step S3 in FIG. 8).

(3) Then, the oxidation treatment for the coating film on the wafer W was performed while the wafer W was being heated in the oxidation treatment unit 34. The oxidation treatment for the wafer W was performed in an atmosphere of water vapor and nitrogen gas at a heating temperature of 105° C. for one minute (Step S4 in FIG. 8).

(4) Then, the wafer W was baked in the heating furnace 4. The baking processing for the wafer was performed in the atmosphere of the nitrogen gas at a baking temperature of 950° C. for 30 minutes (Step S5 in FIG. 8).

Figure 12:
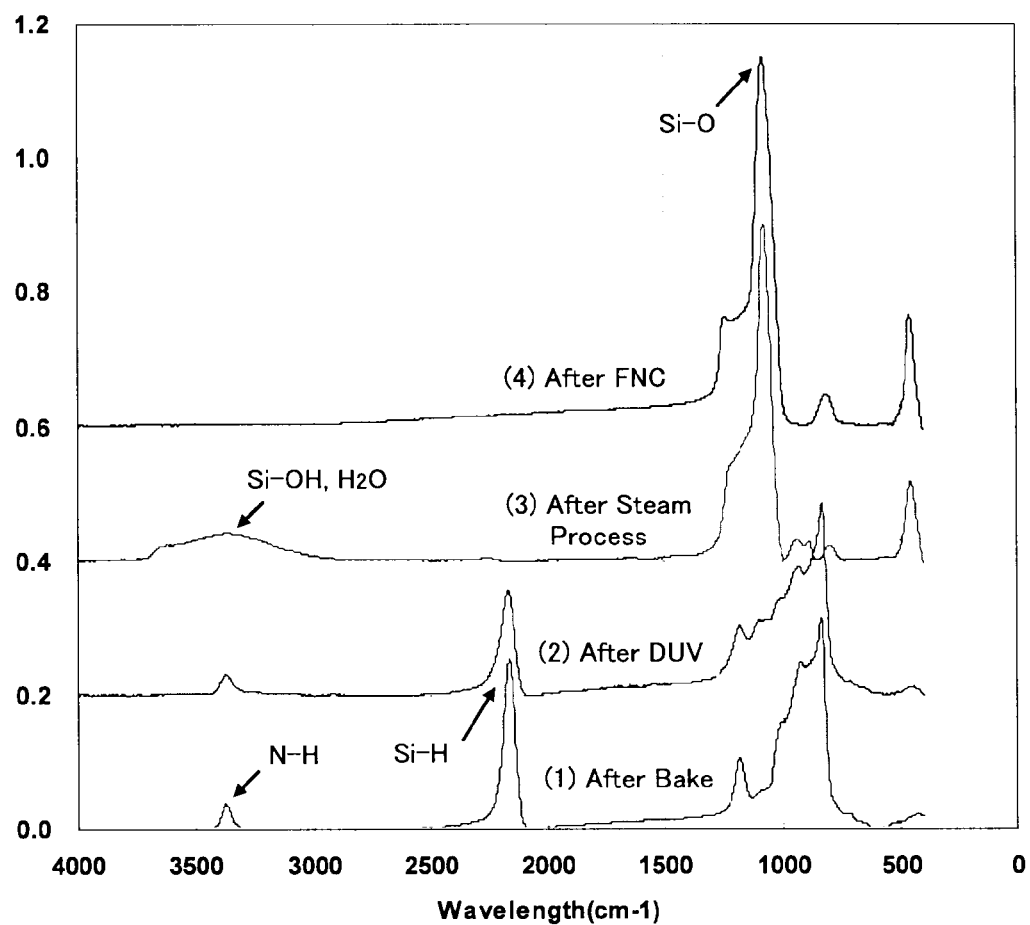
FIG. 12 is a graph showing FTIR spectrum of the coating film on a wafer in an example.
Figure 13:
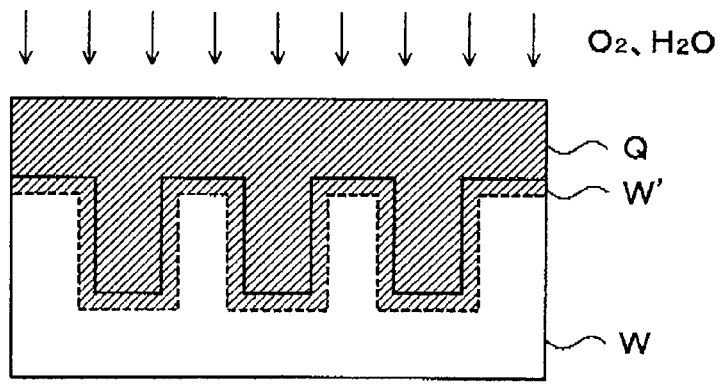
FIG. 13 is an explanatory view showing an appearance of a coating film when the coating film is formed by a processing method in a prior art.
Figure 14:
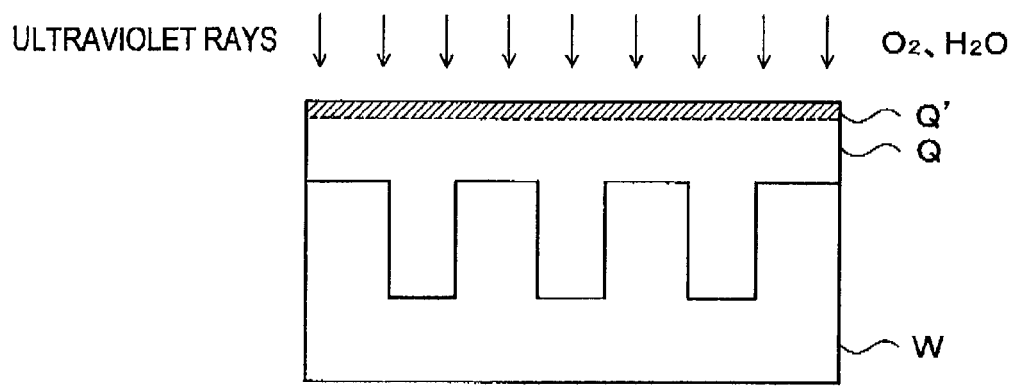
FIG. 14 is an explanatory view showing an appearance of the coating film when the coating film is formed by the processing method in the prior art.

The measurement results of the FTIR spectrum of the coating film on the wafer W in the steps (1) to (4) of processing for the wafer W performed as described above are shown in FIG. 12. The vertical axis indicates the FTIR spectrum of the wafer W and the horizontal axis indicates the wavelength of the infrared rays. Referring to FIG. 12, in the coating film after the heating step in (1), peaks were measured between 3000 $cm^{-1}$ and 3500 $cm^{-1}$ and between 2000 $cm^{-1}$ and 2500 $cm^{-1}$, these peaks indicating the molecular bond of N—H and the molecular bond of Si—H respectively. In other words, after the heating processing was performed, the molecular bond of N—H and the molecular bond of Si—H of polysilazane remain in the coating film. In the coating film after the ultraviolet irradiation step in (2), the molecular bond of N—H and the molecular bond of Si—H still remain in the coating film as in the coating film after the heating process in (1). In the coating film after the oxidation step in (3), peaks were measured between 3000 $cm^{-1}$ and 3500 $cm^{-1}$ and between 1000 $cm^{-1}$ and 1500 $cm^{-1}$, these peaks indicating the molecular bond of Si—OH and the molecular bond of $H_2O$ and Si—O respectively. In other words, this indicates that the coating film was oxidized in which N in the coating film was substituted by O, and H in the coating film was substituted by OH in the oxidation step. In the coating film after the baking step in (4), a peak was measured between 1000 $cm^{-1}$ and 1500 $cm^{-1}$, the peak indicating the molecular bond of Si—O. In other words, this indicates that OH of Si—OH remaining in the coating film after the oxidation step of (3) dehydrated and condensed, and Si—OH was substituted by molecular bond of Si—O in the baking step. The above fact shows that according to this example, a $SiO_2$ film that is the desired coating film can be appropriately formed on the wafer W when using the processing method of the present invention.

What is claimed is:

1. A substrate processing method by a substrate processing apparatus, comprising:
    a coating step of applying a coating solution containing polysilazane to a substrate to form a coating film;
    a cooling step of cooling the coating film formed on the substrate;
    an ultraviolet irradiation step of applying in a first treatment container an ultraviolet ray to the cooled coating film to cut a molecular bond of polysilazane in the coating film;
    an oxidation step of oxidizing the coating film by water vapor in which the molecular bond of polysilazane has been cut while heating the coating film in a second treatment container that is different from the first treatment container, the oxidation step performed after the ultraviolet irradiation step; and
    a baking step of baking the oxidized coating film in a third treatment container, the baking step performed after the oxidation step,
    wherein a heating temperature of the coating film in said oxidation step is equal to or lower than a baking temperature of the coating film in said baking step, and the first, second, and third container are provided in the same substrate processing apparatus.

2. The substrate processing method as set forth in claim 1, wherein the coating film is dehydrated and condensed in said baking step.

3. The substrate processing method as set forth in claim 1, wherein a wavelength of the ultraviolet ray applied to the coating film formed on the substrate in said ultraviolet irradiation step ranges from 150 nm to 200 nm.

4. The substrate processing method as set forth in claim 3, wherein the wavelength of the ultraviolet ray applied to the coating film formed on the substrate in said ultraviolet irradiation step is 172 nm.

5. The substrate processing method as set forth in claim 1, wherein said ultraviolet irradiation step is performed in an atmosphere of an oxidizing gas.

6. The substrate processing method as set forth in claim 5, wherein the oxidizing gas is a mixed gas generated by mixing an oxygen gas and a nitrogen gas, and
    a mixture ratio of the oxygen gas and the nitrogen gas are set depending on a kind of the coating film, a dimension of a pattern to be formed in the coating film and a film thickness of the coating film.

7. The substrate processing method as set forth in claim 1, wherein said oxidation step is performed in an atmosphere of water vapor.

8. The substrate processing method as set forth in claim 1, wherein said oxidation step and said baking step are successively performed in a single unit.

9. The substrate processing method as set forth in claim 8, wherein said oxidation step and said baking step are successively performed in a heating furnace into which water vapor is able to be supplied.

10. A non-transitory computer readable storage medium storing a program, which when executed on a computer of a control unit for controlling a substrate processing apparatus, causes a substrate processing method to be executed by the substrate processing apparatus,
    said substrate processing method comprising:
    a coating step of applying a coating solution containing polysilazane to a substrate to form a coating film;

a cooling step of cooling the coating film formed on the substrate;

an ultraviolet irradiation step of applying in a first substrate container an ultraviolet ray to the cooled coating film to cut a molecular bond of polysilazane in the coating film;

an oxidation step of oxidizing the coating film by water vapor in which the molecular bond of polysilazane has been cut while heating the coating film in a second treatment container that is different from the first treatment container, the oxidation step performed after the ultraviolet irradiation step; and a baking step of baking the oxidized coating film in a third treatment container, the baking step performed after the oxidation step, wherein a heating temperature of the coating film in said oxidation step is equal to or lower than a baking temperature of the coating film in said baking step, and the first, second, and third container are provided in the same substrate processing apparatus.

* * * * *